United States Patent [19]

Sakashita et al.

[11] Patent Number: 5,130,647
[45] Date of Patent: Jul. 14, 1992

[54] SCAN TEST CIRCUIT AND SEMICONDUCTOR INTEGRATED CIRCUIT DEVICE USING THE SAME

[75] Inventors: Kazuhiro Sakashita; Takeshi Hashizume, both of Hyogo, Japan

[73] Assignee: Mitsubishi Denki Kabushiki Kaisha, Tokyo, Japan

[21] Appl. No.: 641,195

[22] Filed: Jan. 14, 1991

[30] Foreign Application Priority Data

Jan. 23, 1990 [JP] Japan ................................. 2-14392

[51] Int. Cl.⁵ ...................... G01R 15/12; G06F 11/00
[52] U.S. Cl. ............................. 324/158 R; 324/73.1; 371/22.3
[58] Field of Search .......... 324/73.1, 158 R; 371/22.3, 22.5, 22.4, 15.1, 25.1, 27, 22.6; 307/303.1; 357/68

[56] References Cited

U.S. PATENT DOCUMENTS

| | | | |
|---|---|---|---|
| 4,780,666 | 10/1988 | Sakashita et al. | 324/73.1 |
| 4,864,579 | 9/1989 | Kishida et al. | 371/22.3 |
| 4,870,345 | 9/1989 | Tomioka et al. | 371/22.3 |
| 4,995,039 | 2/1991 | Sakashita et al. | 371/22.3 |
| 5,008,618 | 4/1991 | Van Der Star | 324/158 R |

FOREIGN PATENT DOCUMENTS 56-74668 11/1979 Japan .
63-38179 2/1988 Japan .
63-38184 2/1988 Japan .

OTHER PUBLICATIONS

DasGupta et al., "An Enhancement to LSSD and Some Applications of LSSD in Reliability, Availability, and Serviceability", International Symposium on Fault-Tolerant Computing (Proceedings), IEEE, 1980.

Primary Examiner—Vinh Nguyen
Attorney, Agent, or Firm—Lowe, Price, LeBlanc & Becker

[57] ABSTRACT

A data scan test circuit includes first through fourth latch circuits (L10 through L40). Data are latched in the third latch circuit (L40). A scan register consisting of the first, second and fourth latch circuits (L10, L20, L30) which become necessary when circuit blocks (CB1, CB2) are tested is made effective. Thus, unnecessary scan registers are put in the "through" state, thereby substantially reducing the number or scan paths in scan operation, and shortening the test time.

15 Claims, 16 Drawing Sheets

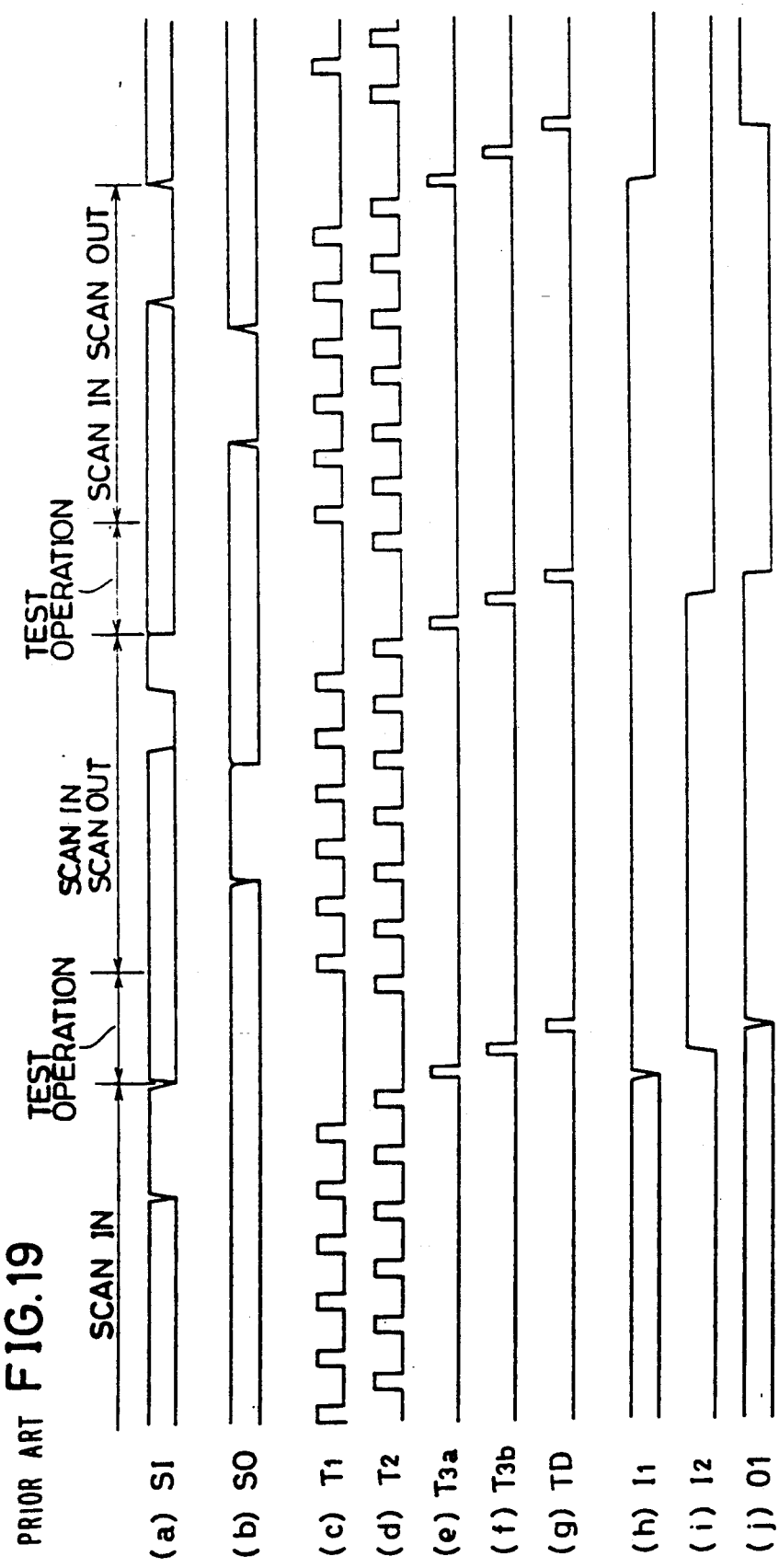
PRIOR ART FIG.19

SCAN TEST CIRCUIT AND SEMICONDUCTOR INTEGRATED CIRCUIT DEVICE USING THE SAME

BACKGROUND OF THE INVENTION

1. Field of the Invention

This invention relates to a scan test circuit and a semiconductor integrated circuit device using the same. More particularly, the invention relates to a scan test circuit including a scan register to be incorporated in a semiconductor integrated circuit device for testing the latter, and it also relates to a semiconductor integrated circuit device using the same.

2. Description of the Background Art

With the progress of the minute processing technique, the degree of integration of semiconductor integrated circuits has surprisingly increased and tends to continue to further increase after this. With such increase in the degree of integration (the number of gates), the difficulty involved in testing semiconductor integrated circuits has exponentially increased. The degree of ease of testing a device is determined by two points, the ease with which the faults of terminals are observed (observability) and the ease with which terminals are set at desired logic values (controllability). Generally, the deep terminals of a large scale logic network become worse both in observability and controllability.

Methods for testing semiconductor integrated circuit devices include one method called a scan test. In this scan test, register circuits having the shift register function are inserted in suitable places in a logic network, and are connected to a single shift register path. During test, a test pattern is serially inputted from outside the chip and predetermined data are set in the registers. A logic circuit is connected to the data output terminal of each register, and a desired logic signal is inputted to the logic circuit. Each logic circuit operates in response to its logic signal, and the result is fed in parallel into the register through the parallel input terminal of the register. Thereafter, the data set in the register are serially outputted outside the chip, and observation of the output makes it possible to improve the observability and controllability of the deep terminals of a large scale logic network.

Further, scan test circuits directed to asynchronous sequential circuits are disclosed in Japanese Patent Laid-Open Nos. 74668/1981, 38179/1988 and 38184/1988. The prior art disclosed in Japanese Patent Application No. 38184/1988 will now be described.

FIG. 16 is a block diagram showing an example of a conventional scan test circuit for making scan tests. Referring to FIG. 16, the scan test circuit SRL includes latch circuits L1, L2 and L3 and inverters 1 through 4. Serial data are inputted to the inverter 1 from a second input terminal SI. The output of the inverter 1 is given to the latch circuit L1. The latch circuit L1 comprises inverters 5 and 6 and transfer gates 13 and 15 in the form of n MOS transistors. The input of the inverter 5 is connected to the output of the inverter 6, while the output of the inverter 5 is connected to the input of the inverter 6, thereby forming a register.

A transfer gate 13 is connected between the input of the inverter 5 and the output of the inverter 2. The inverter 2 has data inputted thereto from a first input terminal D1. The gate of the transfer gate 13 is given a clock signal from an input terminal TD. A transfer gate 15 is connected between the input of the inverter 5 and the output of the inverter 1, and the gate of the transfer gate 15 is given the clock signal through an input terminal T1. The output of the latch circuit L1 is given to the latch circuits L2 and L3. The latch circuit L2 comprises inverters 7 and 8 and a transfer gate 19. The input of the inverter 7 is connected to the output of the inverter 8, while the output of the inverter 7 is connected to the input of the inverter 8, thereby forming a register. A transfer gate 19 is connected between the input of the inverter 7 and the output of the latch circuit L1, and the gate of the transfer gate 19 is given the clock signal from the input terminal T2. The output signal from the latch circuit L2 is given to the second output terminal SO through the inverter 4.

The latch circuit L3 comprises inverters 9 and 10 and a transfer gate 17. The input of the inverter 9 is connected to the output of the inverter 10, while the output of the inverter 9 is connected to the input of the inverter 10, thereby forming a register. The transfer gate 17 is connected between the input of the inverter 9 and the latch circuit L1, and the gate of the transfer gate 17 is given the clock signal from the input terminal L3. The output signal from the latch circuit L3 is outputted to the first output terminal DO through the inverter 3.

FIG. 17 is a block diagram showing a semiconductor integrated circuit chip provided with the scan test circuit shown in FIG. 16. Referring to FIG. 17, the single chip contains circuit blocks CB1 and CB2 to be tested. The output terminals DO of the scan test circuits SRL1 and SRL2 are connected to the input terminals I1 and I2 of the circuit block CB1, respectively. The input terminals DI of the scan test circuits SRL3 and SRL4 are connected to the output terminal 01 of the circuit block CB1, while the output terminals DO of the scan test circuits SRL3 and SRL4 are connected to the input terminals I1 and I2 of the circuit block CB2.

The input terminals DI of the scan test circuits SRL5 and SRL6 are connected to the output terminals 01 and 02 of the circuit block CB2. Scan test circuits SRL1 through SRL6 are connected between the serial data input terminal SI, and the serial data output terminal SO, of the chip, thereby forming a scan path. The input terminal T3 of the scan test circuit SRL1 is connected to the clock input terminal T3a of the chip. The input terminals T3 of the scan test circuits SRL2, SRL3 and SRL4 are connected to the input terminal T3b of the chip and are given the clock signal. The input terminals TD of the scan test circuits SRL3 through SRL6 are connected to the input terminal TD of the chip and are given the clock signal.

FIG. 18 is a flowchart for explaining the operation for testing the circuit block shown in FIG. 17, and FIG. 19 is a timing chart.

Referring to FIGS. 16 and 19, the operation of a conventional scan test circuit will now be described. The circuit block is divided into two parts, one for normal operation and the other for test operation. During normal operation, signals given to the test input terminals T1 and T2 of the chip are set at "L" level, and signals given to the input terminals TD, T3a and T3b are set at "H" level. With signals thus set, in the scan test circuit SRL shown in FIG. 16, the transfer gates 13 and 17 are rendered conductive, while the transfer gates 15 and 19 are rendered nonconductive. Thereby, the latch circuit L1 becomes a through-circuit by which data inputted from the input terminal DI through the inverter 2 are passed through, and the latch circuit L3 also acts as a through-circuit by which data inputted from the latch circuit L1 are passed through to the inverter 3.

On the other hand, the latch circuit L2 is in the data holding state since the transfer gate 19 is held nonconductive. Therefore, the scan test circuits SRL shown in FIG. 16 are inhibited from receiving data from the serial data input terminals SI; therefore, the path from the input terminal DI to the output terminal DO acts simply as a data transfer circuit. Thus, since the path from the input terminal DI to the output terminal DO in the scan test circuit SRL between the circuit blocks CB1 and CB2 assumes the data-through state, the line between the circuit blocks CB1 and CB2 assumes the logically conductive state, performing the same logic function as before the scan test circuits SRL1 through SRL6 are inserted.

The test operation will now be described. The test operation is divided into two modes: a scan operation mode and a block test operation mode. In the scan operation mode, test patterns for the circuit blocks CB1 and CB2 to be tested are serially inputted from the serial data input terminals SI and, simultaneously, output data from the circuit blocks CB1 and CB2 to be tested are serially outputted from the serial data terminals SO. And in the block test operation mode, test patterns for the circuit block CB1 and CB2 to be tested which are inputted to the scan test circuits SRL1 through SRL6 are synchronized with clock signals given to the input terminals T3a and T3b and inputted to the input terminals of the circuit blocks CB1 and CB2 to be actually tested. Then, test data are held in the latch circuit L1 within the corresponding scan test circuit SRL synchronized with the response waveform. The scan operation mode and block test mode are alternately repeated for each pattern in the circuit block to be tested, whereby the scan test of the circuit block to be tested is achieved. Further, the test of the chip is achieved by repeating the processing in this procedure the same number of times as the number of circuit blocks to be tested existing in the chip.

The test operation will be further described with the chip shown in FIG. 17 taken as an example. This chip includes circuit blocks CB1 and CB2, and by testing the circuit blocks CB1 and CB2, the test of the chip can be achieved. The test patterns necessary for the test of the circuit blocks CB1 and CB2 are shown in Tables 1A and 1B, respectively.

TABLE 1B

| | CB1 Test Patterns | | |
| --- | --- | --- | --- |
| | Input | | Output |
| | I1 | I2 | O1 |
| 1 | H | H | H |
| 2 | H | L | L |
| 3 | L | L | H |
| 4 | L | H | H |

TABLE 1A

| | CB2 Test Patterns | | | |
| --- | --- | --- | --- | --- |
| | Input | | Output | |
| | I1 | I2 | O1 | O2 |
| 1 | L | L | H | L |
| 2 | H | L | H | H |
| 3 | L | H | H | H |

TABLE 1A-continued

| | CB2 Test Patterns | | | |
| --- | --- | --- | --- | --- |
| | Input | | Output | |
| | I1 | I2 | O1 | O2 |
| 4 | H | H | L | H |

As shown in Table 1A, four patterns are required as test patterns for the circuit block CB1. For example, if the input terminals I1 and I2 of the circuit block CB1 are given "H", "H" level signals with desired timing, an output signal at "H" level is given from the output terminal O1 of the circuit block CB1. Similarly, for "H", "L" signals, there is obtained an output signal at "L" level; and for "L", "H" signals, there is obtained an output signal at "H" level. Similarly, the circuit block CB2 can be tested by observing the output patterns associated with the input patterns.

These test patterns are serially inputted to the serial data input terminal SI' and transferred on the scan path, and input data are set ion a desired scan test circuit SRL. Further, in order to serially output the test patterns shown in Tables 1A and 1B have to be converted into serial data. Test patterns are converted into such serial data are shown in Tables 2A and 2B.

TABLE 2A   TABLE 2B

| | Chip Test Patterns (Scan Path Input/Output Serial Data) | | |
| --- | --- | --- | --- |
| SCAN | Input Pattern | | Output Pattern |
| #1 | XXXXHH | | XXXXXX |
| 2 | XXXXLH | CB1 | XXHHXX |
| 3 | XXXXLL | test | XXLLXX |
| 4 | XXXXHL | | XXHHXX |
| 5 | XXLLXX | | XXHHXX |
| 6 | XXHLXX | | LHXXXX |
| 7 | XXLHXX | CB2 | HHXXXX |
| 8 | XXHHXX | test | HHXXXX |
| 9 | XXXXXX | | HLXXXX |

Table 2A shows test input patterns inputted from the serial data input terminal SI', while Table 2B shows test output patterns outputted from the serial data output terminal SO'. In FIG. 17, six scan test circuits SRL1 through SRL6 are connected on the scan path extending from the serial data input terminal SI' to the serial data output terminal SO'; therefore, an amount of clock signal corresponding to periods is required for each scan operation. In Tables 2A and 2B, the mark X indicates dummy data required during scan shift, said dummy data being required when test input data from the serial data input terminal are set in a predetermined scan test circuit SRL to provide the shift necessary for outputting the test output data from the predetermined scan test circuit SRL to the scan data output terminal SO'.

The number of test patterns necessary for testing the circuit block CB1 is four, and also four test patterns are required for testing the circuit block CB2. Further, as is clear from the flow chart showing in FIG. 18, one pattern is required for outputting the test output data from the serial data output terminal SO after completion of the test operation of the circuit block CB2. Therefore, a total of nine patterns are used to complete the test of the chip. The serially converted data are serially inputted from the serial data input terminal SI' in the scan mode. During test operation, the blocks are tested by repetitively performing the scan mode and the test mode.

FIG. 19 is a timing chart showing the timing for the parts shown in FIG. 18. The scan mode will now be described in more detail with reference to FIG. 19. As shown in FIG. 19 (g), a clock signal at "L" level is given to the input terminal TD. As shown in FIG. 19 (c) and (d), the input terminals T1 and T2 are given scan clock signals as non-overlapping, positive clock signals. Synchronously therewith, data from the scan data input terminal SI' are successively "scanned in" to the scan test circuits SRL1 through SRL6. An amount of scan signal corresponding to six periods is required to input desired data to a predetermined scan test circuit SRL. At the same time, as shown in FIG. 19 (b), the output data from the circuit block CB1 or CB2 taken into the predetermined scan test circuit in the preceding test (in the example shown in FIG. 17, the scan test circuit SRL3, SRL4 or SRL5, SRL6) are successively scanned out.

The test mode will now be described. When desired test input data are set in a predetermined scan test circuit SRL, a single positive clock pulse shown in FIG. (e) and (f) is given to the input terminals T3a and T3b. Thereby, the test input data are latched in the third latch circuit L3 of the scan test SRL and is given to the circuit block CB1. At the time when the respective operations of the circuit blocks CB1 and CB2 are completed, a positive clock pulse is given to the input terminal TD as the data clock signal shown in FIG. 19 (g). Thereby, the output signal from each circuit block is latched in the first latch circuit L1 of the corresponding scan circuit SRL through the input terminal DI of the scan test circuit SRL.

Subsequently, a single positive clock pulse is given to the input terminal T2 as a second scan clock signal, whereby the output signal from the circuit block is retained in the second latch circuit L2 of the scan test circuit SRL. Thereafter, the mode is changed to the scan mode and the test proceeds.

The circuit blocks CB1 and CB2 are tested in this manner. In the circuit shown in FIG. 17, the latch circuit latches the preceding test pattern, which continues to be given to the input terminals I1 and I2 of the circuit blocks CB1 and CB2, so that even if the values of the latch circuits L1 and L2 change during scan operation, the internal states of the circuit blocks CB1 and CB2 remain unchanged, making the scan test possible.

In addition, in the above example, asynchronous circuits have been employed as the circuit blocks CB1 and CB2 and the circuit shown in FIG. 16 has been used as a corresponding scan test circuit. However, if synchronous circuits are employed as the scan test circuits, the third latch circuit L3 shown in FIG. 16 becomes unnecessary.

FIGS. 20 and 21 are block diagrams showing scan test circuits wherein synchronous circuits are employed as circuit blocks to be tested. In the example shown in FIG. 20, the latch L3 and the input terminal T3 for receiving the clock signal shown in FIG. 16 are omitted, and the input of the inverter 3 is connected to the input of the inverter 5. In the example shown in FIG. 21, not only the latch circuit L3 and input terminal T3 but also the inverter 3 is omitted, and the output of the inverter 4 is connected to the output terminal DO. In addition, in the scan test circuits shown in FIGS. 20 and 21, the dummy pattern described above is required.

Since the conventional test scan circuit is arranged in the manner described above, when the scan test of the circuit blocks CB1 and CB2 is to be made, there are scan test circuits which are unnecessary in this test. For example, when it is desired to test only the circuit block CB1, the scan test circuits SRL1 through SRL4 would have only to be operated; actually, however, the scan test circuits SRL5 and SRL6 also have to be shifted. Therefore, dummy data which are unnecessary in the scan operation during test have to be scanned in at the same time. This means that an amount of dummy data corresponding to one scan clock period is required for the scan test circuit SRL1. Thus, for the overall scan operation, a large amount of test time is wasted.

SUMMARY OF THE INVENTION

Accordingly, the main object of the invention is to provide a scan test circuit wherein the scan operation is made possible with only the same number of scan clock periods as the number of the scan test circuits required during scan operation, and it also provides a semiconductor integrated circuit device using the same.

In brief, in the invention, besides the conventional first and second latch circuits, a third latch circuit and a function for resetting said third latch circuit are incorporated. In response to the third latch circuit being of first logic, 1-bit data included in the serial data inputted to the second input terminal ar outputted from the second input terminal to the output terminal in a "through" manner, while 1-bit data to be inputted to the first input terminal are inhibited from being inputted to the first latch circuit. In response to the input of a control signal, the serial data inputted to the third latch circuit through the first latch circuit are latched. The third latch circuit is reset by a reset signal and when its output is inverted to the second logic, the data inputted to the first or second input terminal are allowed to be shifted from the first latch circuit to the second latch circuit.

Therefore, according to this invention, only the scan register which becomes necessary when making the scan test of a circuit picked up by the data is made effective, with the unnecessary scan registers being placed in the through state. Therefore, the number of scan paths for scan operation can be substantially reduced, shortening the test time.

In a preferred embodiment, there is provided a fourth latch circuit for latching the data which are latched in the first latch circuit and outputting said data to the second output terminal. In response to the output of the fourth latch circuit being of first logic, the data latched in the first latch circuit are inhibited from being inputted to the fourth latch circuit. In response to the output of the third latch circuit being of second logic, the data latched in the first latch circuit are allowed to be shifted to the fourth latch circuit.

The foregoing and other objects, features, aspects and advantages of the present invention will become more apparent from the following detailed description of the present invention when taken in conjunction with the accompanying drawings.

BRIEF OF THE DRAWINGS

FIG. 19 is a timing chart for explaining the operation of a conventional test circuit.

DESCRIPTION OF THE PREFERRED EMBODIMENTS

Figure 1:
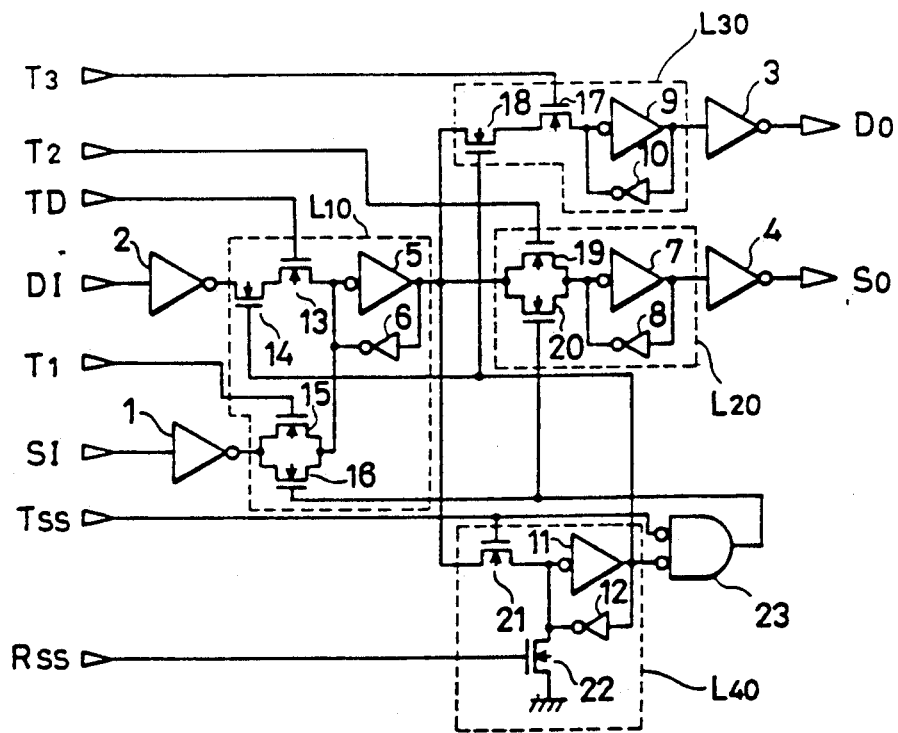
FIG. 1 is a block diagram showing a scan test circuit according to an embodiment of the invention.
Figure 16:
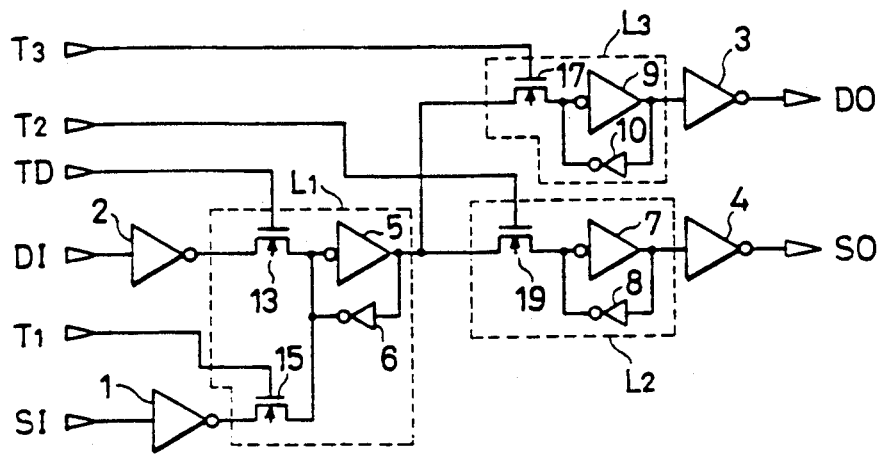
FIG. 16 is a block diagram of a conventional scan test circuit.
Figure 20:
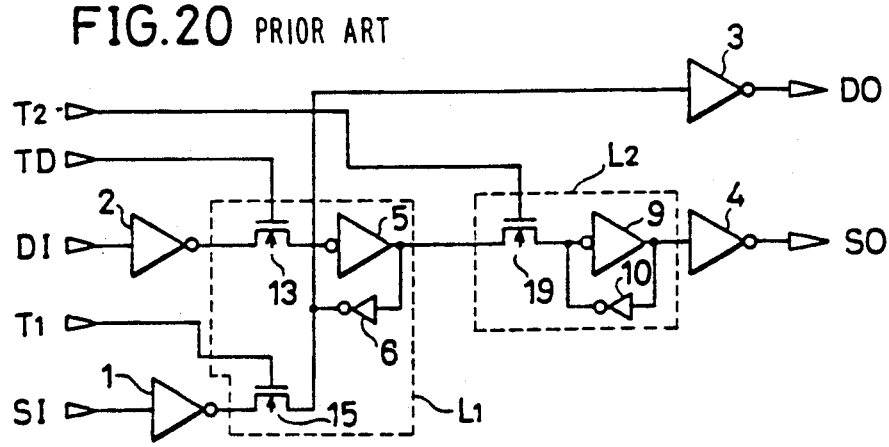
FIGS. 20 and 21 are block diagrams showing other examples of scan test circuits.
Figure 21:
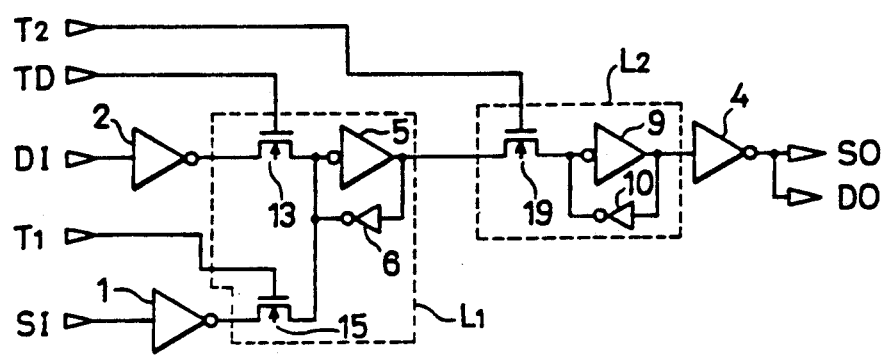

FIG. 1 is a block diagram showing a scan test circuit according to an embodiment of the invention. The scan test circuit shown in FIG. 1 has the following elements in addition to the scan test circuit shown in FIG. 16 described above. That is, a transfer gate 14 is connected in series between a transfer gate 13 and the output of an inverter 2 included in a latch circuit L10, and a transfer gate 18 is connected between a transfer gate 17 included in a latch circuit L30 and the output of the latch circuit L10. Only when these transfer gates 14 and 18 are rendered conductive, data are inputted to the latch circuits L10 and L30.

A transfer gate 16 is connected in parallel with the transfer gate 15 included in the latch circuit L10, and a transfer gate 20 is connected in parallel with a transfer gate 19 included in a latch circuit L20. When the transfer gate 15 or 16 is rendered conductive, serial data inputted to the serial data input terminal SI are inputted to the latch circuit L10. Similarly, when the transfer gate 19 or 20 is rendered conductive, the serial data latched in the latch circuit L10 are inputted to the latch circuit L20. A latch circuit L40 and a NOR circuit 23 are newly provided for controlling the transfer gates 14, 18, 16 and 20. The latch circuit L40 comprises a transfer gate 21, a pull-down circuit 22, and inverters 11 and 12.

The gate of the transfer gate 21 and one input of the NOR circuit 23 are given clock signals inputted to the clock input terminal Tss. The drain of the transfer gate 21 is connected to the output of the latch circuit L10, and its source is connected to the input end of the inverter 11 and the output end of the inverter 12 and also to the drain of the pull-down circuit 22. The gate of the pull-down circuit 22 is given a reset signal inputted to the reset input terminal Rss. The source of the pull-down circuit 22 is grounded. The output end of the inverter 11 is connected to the input end of the inverter 12 and also to the other input end of the NOR circuit 23 and to the gates of the transfer gates 16 and 20.

Figure 2:
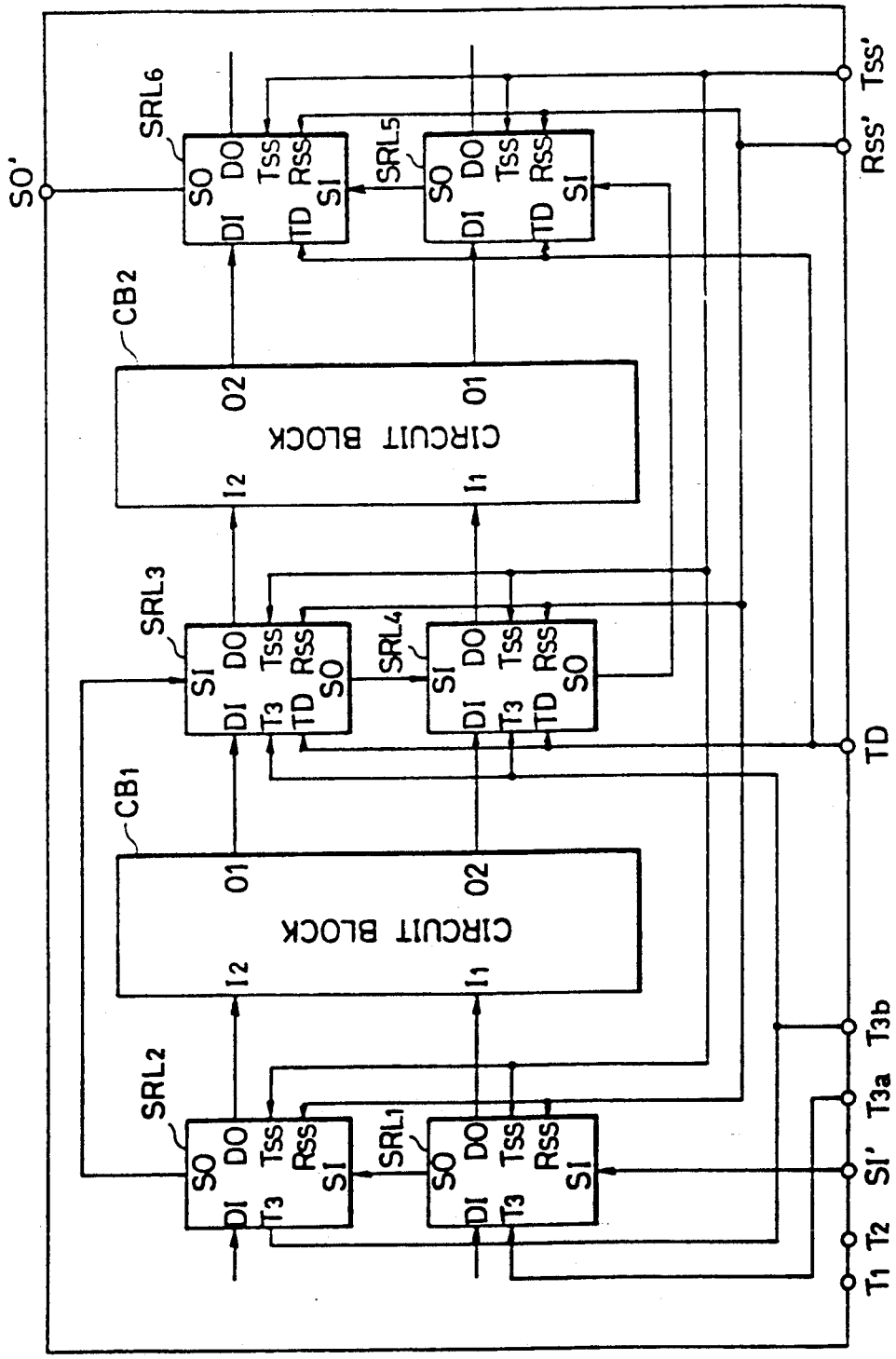
FIG. 2 is a block diagram of a semiconductor integrated circuit device using a scan test circuit according to an embodiment of the invention.
Figure 17:
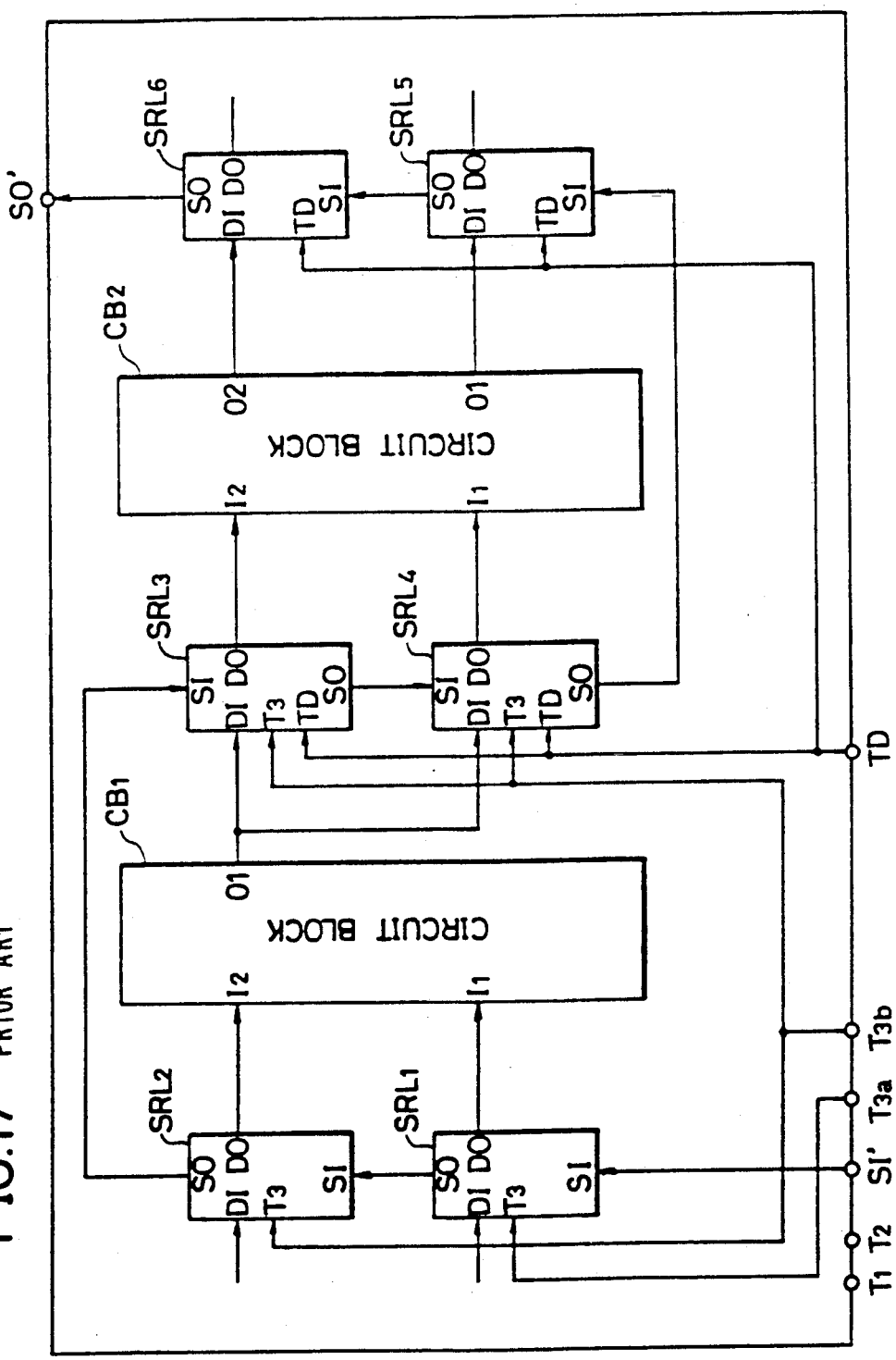
FIG. 17 is a block diagram showing a semiconductor integrated circuit device containing a conventional scan test circuit.
Figure 18:
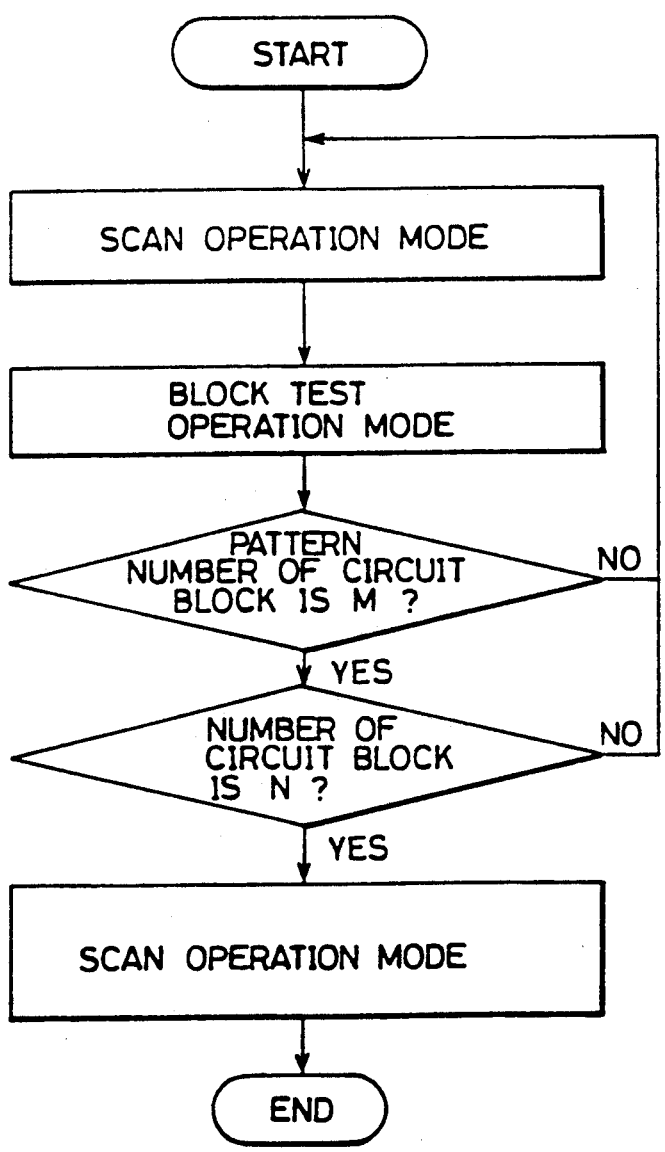
FIG. 18 is a flowchart for explaining the operation of a conventional scan test circuit.

FIG. 2 is a block diagram showing a semiconductor integrated circuit device containing the scan test circuit shown in FIG. 1. Referring to FIG. 2, the circuit blocks CB1 and CB2 to be tested are the same as those shown in FIG. 17 described above. The scan test circuits SRL1 through SRL6 are the same as those shown in FIG. 1. The chip containing the circuit block CB1 and scan test circuits SRL1 through SRL6 is provided with a clock terminal Tss, for giving clock signals to the clock input terminals Tss of the scan test circuits SRL1 through SRL6 and a reset terminal Rss, for giving reset signals to the reset input terminals Rss of the scan test circuits SRL1 through SRL6. The rest of the arrangement is the same as that previously described in FIG. 17.

The operation will now be described. As in the prior example, the operation will be divided into two modes: the normal operation mode and the test operation mode. In the normal operation mode, the input terminals T1, T2 and Tss of the chip are set at "L" level, while the terminals T3a, T3b, TD and Rss are set at "H" level. In the scan test circuit SRL, since the reset signal to be inputted to the reset terminal Rss is at "H" level, the pull down circuit 22 is conductive and the latch L40 is reset. As a result, the output of the inverter 11 is put at "H" level, rendering the transfer gates 14 and 18 conductive, with the NOR circuit 23 assuming "L" level; thus, the transfer gates 16 and 20 are rendered nonconductive.

Further, since the signals to be inputted to the terminals TD and T3, are set at "H" level, the transfer gates 13 and 17 are rendered conductive, and the latches L10 and L30 become "data-through" circuits, with the path extending from the terminal DI to the terminal DO assuming the data-through state. Further, since the signals to be inputted to the terminals T2 and T1 are set at "L" level, the transfer gates 15 and 19 are rendered nonconductive, and the latch L20 is put in the data holding state. And the data inputted to the terminal SI is inhibited from being inputted to the latch circuit L10. Therefore, in FIG. 2, the path extending from the terminal DI to the terminal DO of each of the scan test circuits SRL1 through SRL6 between the circuit blocks CB1 and CB2 is put in the data-through state, with the line between the circuit blocks being in the logically conductive state, performing the same function as that prior to the insertion of the scan test circuits SRL1 through SRL6.

Figure 3:
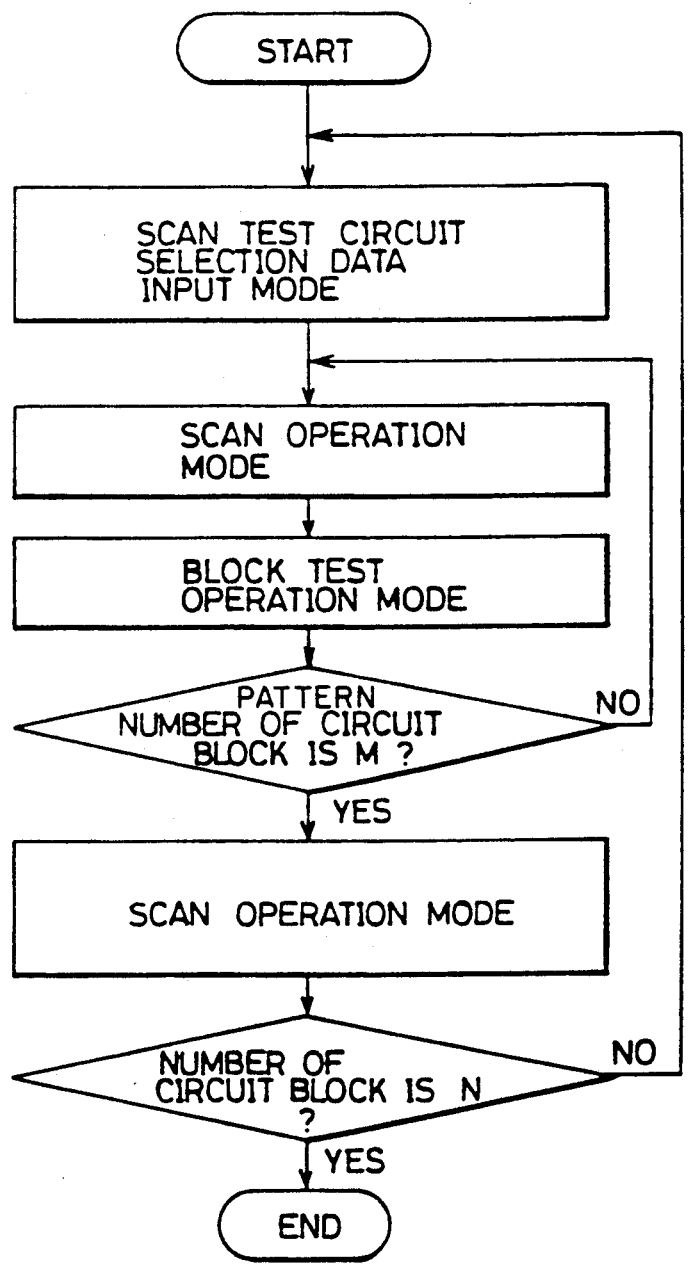
FIG. 3 is a flowchart for explaining the operation of an embodiment of the invention.

FIG. 3 is a flowchart for explaining the test operation of an embodiment of the invention. The test operation will now be described with reference to FIGS. 1 through 3. In the test operation there are a scan test circuit selection data input mode besides the scan operation mode and block test mode described above in the conventional example. First, the operation of the scan test circuit selection data input mode makes effective only a scan test circuit which is necessary for the scan test of a circuit block to be tested and sets the unnecessary scan test circuits in the data-through state; thus, the number of scan stages is reduced.

Then, the scan operation mode and the block test operation mode are alternately performed, whereby the scan test of the subsequent circuit blocks is performed. When the scan test of one circuit block is completed, the scan test of another is performed, and new scan test circuit selection data are inputted. This is repeated the same number of times as the number of circuit blocks, whereby the test of the chip is completed. An operation according to the invention will now be described with the chip shown in FIG. 2 taken as an example. The test patterns of the circuit blocks CB1 and CB2 are determined as shown in Table 1 in the same manner as in the conventional example. The test according to these test patterns is performed in the order CB1, CB2. And to transmit desired data to the scan path shown in FIG. 2 and set them in a predetermined scan test circuit SRL, serial conversion of the test pattern is effected. Such test patterns are shown in Tables 3A and 3B.

TABLE 3A

| Scan | Input Pattern (SI') | |
|---|---|---|
| #1 | HHLLLL | CB1 I/O connection (SRL1-4) selection data |
| 2 | XXHH | |
| 3 | XXLH | |
| 4 | XXLL | CB1 input pattern |
| 5 | XXHL | |
| 6 | XXXX | |
| 7 | LLLLHH | CB2 I/O connection SRL (SRL3-6) selection data |
| 8 | XXLL | |
| 9 | XXHL | |
| 10 | XXLH | CB2 input pattern |
| 11 | XXHH | |
| 12 | XXXX | |

TABLE 3B

| Scan | Output Pattern (SO') | |
|---|---|---|
| #1 | XXXXXX | |
| 2 | XXXX | |
| 3 | HHXX | |
| 4 | LLXX | CB1 output pattern |
| 5 | HHXX | |
| 6 | HHXX | |
| 7 | XXXXXX | |
| 8 | XXXX | |
| 9 | LHXX | |
| 10 | HHXX | CB2 output pattern |
| 11 | HHXX | |
| 12 | HLXX | |

Table 3A shows scan test circuit selection data to be inputted from the scan path input terminal SI and test input patterns for the circuit blocks CB1 and CB2. The input patterns associated with the scan #=1 and the scan #=7 are the scan test circuit selection data. Because of the construction of the scan test circuit shown in FIG. 1, the output section of the latch circuit L40 for selecting a scan test circuit has the output inverting signal for the latch circuit L40 latched therein; therefore, the signal shifted and inputted while serving as the scan test circuit selection signal becomes a nonselection signal when it is at "H" level and a selection signal when it is at "L" level.

In the scan test circuit SRL, since scan test circuit selection data are successively scanned in the order "terminal SI→SO", the pattern for selecting the scan test circuits SRL1 through SRL4 connected to the I/O side (I1, I2, O1) of the circuit block CB1 is "H, H L, L, L, L". Similarly, the pattern for selecting the scan test circuits SRL3 through SRL6 connected to the I/O side (I1, I2, O1, O2) of the circuit block CB2 is "L, L, L, L, H, H".

The number of periods of scan shift clock signal necessary for setting the test input pattern in the predetermined scan test circuit SRL is equal to the number of scan test circuits selected by the scan test circuit selection data. For example, when the circuit block CB1 is to be tested, there is a total of four scan test circuits: the scan test circuits SRL1 and SRL2 on the input side of the circuit block CB1 and the scan test circuits SRL3 and SRL4 on the output side of the circuit block CB1. Thus, an amount of scan shift clock signal corresponding to four periods is required for one scan shift operation. Table 3B shows output patterns outputted from the scan path output terminal SO. In addition, the mark X in Tables 3A and 3B indicates a dummy pattern.

Figure 4:
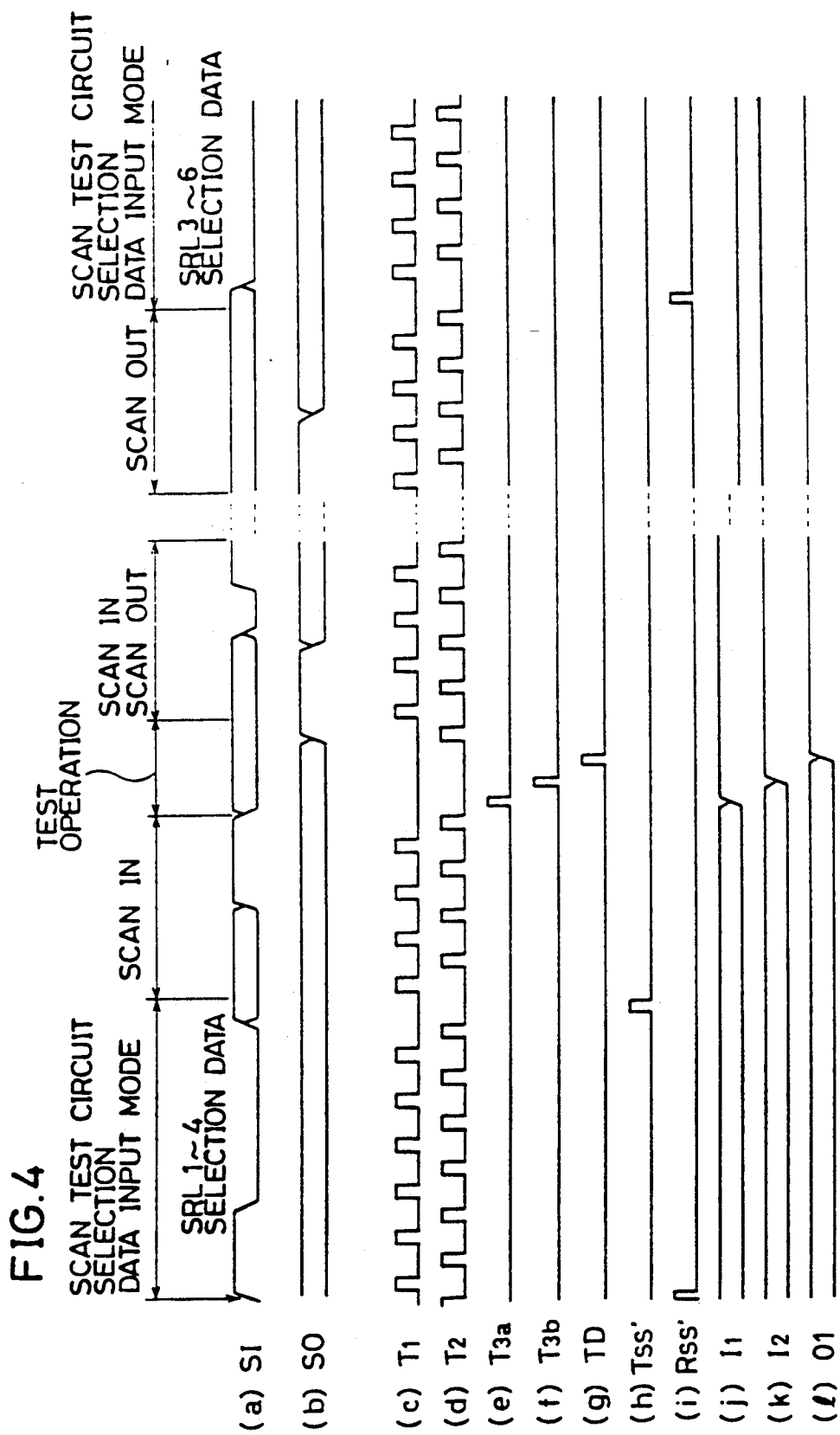
FIG. 4 is a timing chart for explaining the operation of an embodiment of the invention.

FIG. 4 is a timing chart of the operation during the test of a chip in an embodiment of the invention. The test operation will now be described concerning the test patterns shown in Tables 3A and 3B with reference to FIG. 2.

Scan test circuit selection data input mode:

A single positive clock pulse shown in FIG. 4 (i) is given to the clock input terminal Rss,. Thereby, the scan test circuit selection data latch (L40 shown in FIG. 1) for all scan test circuits is reset, and all scan test circuits assume the selection state. That is, all scan test circuits SRL are caused to perform scan shift operation by the scan shift clock signal inputted to the terminals T1 and T2 shown in FIG. 4 (c) and (d).

Scan test circuit selection data shown in Table 3A are transmitted from the scan-in terminal SI' to the scan path as shown in FIG. 4 (a), and desired data are set in predetermined scan test circuits SRL. At this time, the transmitted scan test circuit selection data are held in the scan shift latches (the latches L10 and L20 as shown in FIG. 1) for the scan test circuits SRL. In response to an amount of scan clock signal corresponding to the number of predetermined scan test circuits, desired scan test circuit selection data are latched in the predetermined scan test circuits SRL, whereupon a single positive clock pulse shown in FIG. 4 (h) is given to the clock input terminal Tss, Thereby, the selection data held in the scan shift latch L10 are inverter and transmitted to the scan test circuit selection data latch L40 and held therein. The scan test circuit SRL with the scan test circuit selection data latch L40 holding the "L" level signal (nonselection signal) becomes a simple data-through circuit. Only the scan test circuit SRL with the scan test circuit selection data latch holding the "H" level signal (selection signal) acts as the normal scan test circuit SRL which effects scan shift operation in response to the scan shift clock signals shown in FIG. 4 (c) and (d).

Scan shift operation mode:

The data clock signal at "L" level shown in FIG. 4 (g) is applied to the data clock input terminal TD, whereby the scan mode is obtained. When nonoverlap positive clock signals shown in FIG. 4 (c) and (d) are given from the first and second scan clock terminals T1 and T2, data are successively scanned in synchronously therewith from the scan-in terminal SI' to the scan test circuits SRL. Simultaneously therewith, the data in the test circuit blocks CB1 and CB2 held in the predetermined scan test circuits SRL in the preceding test are successively scanned out from the scan-out terminal SO'

Test mode:

The operation in the test mode is the same as in the conventional example described previously; therefore, a description thereof will be omitted.

With the above operation performed, the circuit blocks CB1 and CB2 are tested. Basically, the function test of the chip is completed by making a test for each of the circuit blocks CB1 and CB2 present on the chip.

In addition, at the time of test data scan shift, the scan test circuits SRL other than the scan test circuit SRL connected to the input/output terminal of the circuit block to be tested can be caused to operate simply as data-through circuits. However, as the number of serially connected scan test circuits SRL to become data-through increases, the delay time increases, making it difficult to shift the data synchronously with the shift clock.

To avoid this problem, the number of scan test circuits to successively become data-through is limited and if the limit value is exceeded, dummy scan test circuits SRL are selected to attain stabilized scan shift operation synchronously with the scan clock signal given to the scan clock terminals T1 and T2.

Figure 5:
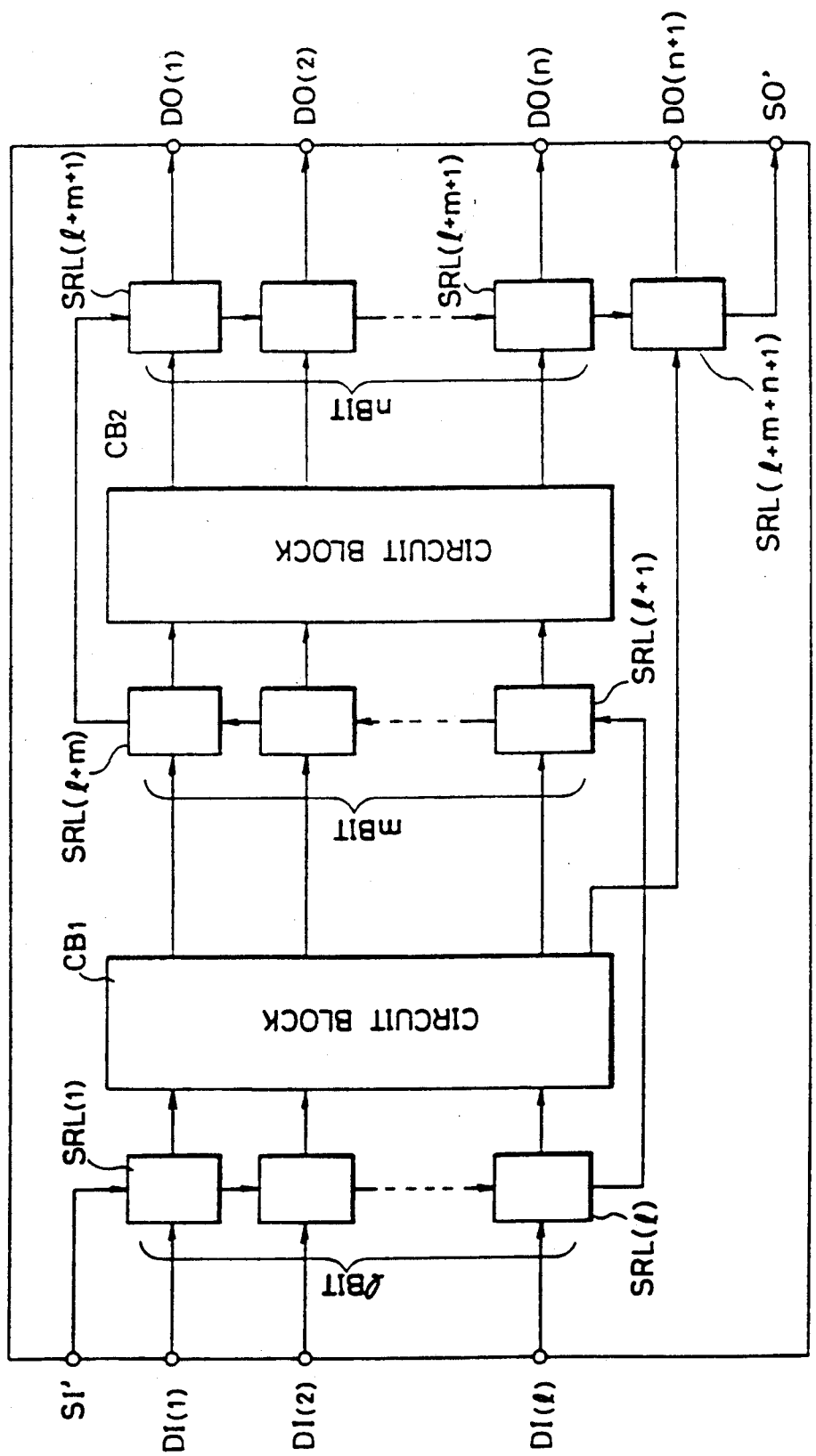
FIG. 5 is a block diagram showing another example of semiconductor integrated circuit device using a scan test circuit.

FIG. 5 is a block diagram showing another embodiment of a scan test circuit. The above-mentioned dummy scan test circuit will now be described with reference to FIG. 5. Referring to FIG. 5, the chip contains circuit blocks CB1 and CB2, said circuit block CB1 having an l-bit input and an (m +1) bit output. The circuit block CB2 has an m-bit input and an n-bit output. The buffers on the input sides of the circuit blocks CB1 and CB2 and output buffer of the chip scan have connected thereto test circuits SRL corresponding to the number of inputs and output. The scan test circuits SRL are serially connected and by means of scan shift clock signal they form a single scan path extending from the scan-in terminal SI' to the scan-out terminal SO'. Scan test circuits SRL (1) through SRL (l) are connected to the input side of the circuit block CB2 in the order in which they are connected to the scan-in terminal SI'. The same scan test circuits SRL (l+1) through SRL (l+m) are connected to the input side of the circuit block CB2, and the scan test circuits SRL (l+m+ 1) through (l+m+n+1) are connected to the output side of the chip.

In addition, the inputs DI (1) ... DI (l) of the chip are connected to the input terminal of the circuit block CB1, and the outputs of the scan test circuits SRL (l+m +1) ... SRL (l+m+n+1) are connected to the output terminals DO (1) ... DO (n+1).

A description will now be given of the scan shift operation in which the delay due to the scan test circuit acting as a data-through circuit becomes a problem. To test the circuit blocks CB1 and CB2, test data are latched in the scan test circuits SRL on the input side of the circuit blocks to be tested and are given to said circuit blocks with desired timing. And their outputs are latched in the scan test circuits SRL on the output side of the circuit blocks and then, by scan operation, they are serially outputted synchronously with scan shift signal inputted to the scan clock terminals T1 and T2 from the serial output terminal SO'.

Figure 6:
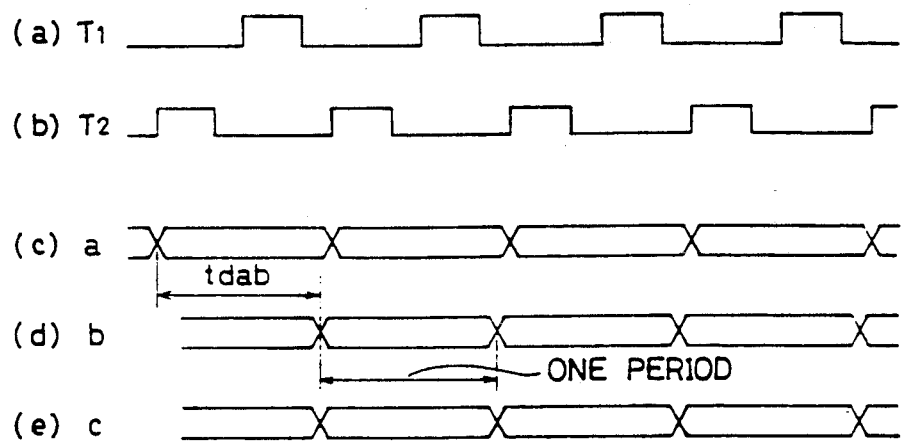
FIGS. 6, 7 and 8 are timing charts for explaining the operation of the semiconductor integrated circuit device shown in FIG. 5.
Figure 7:
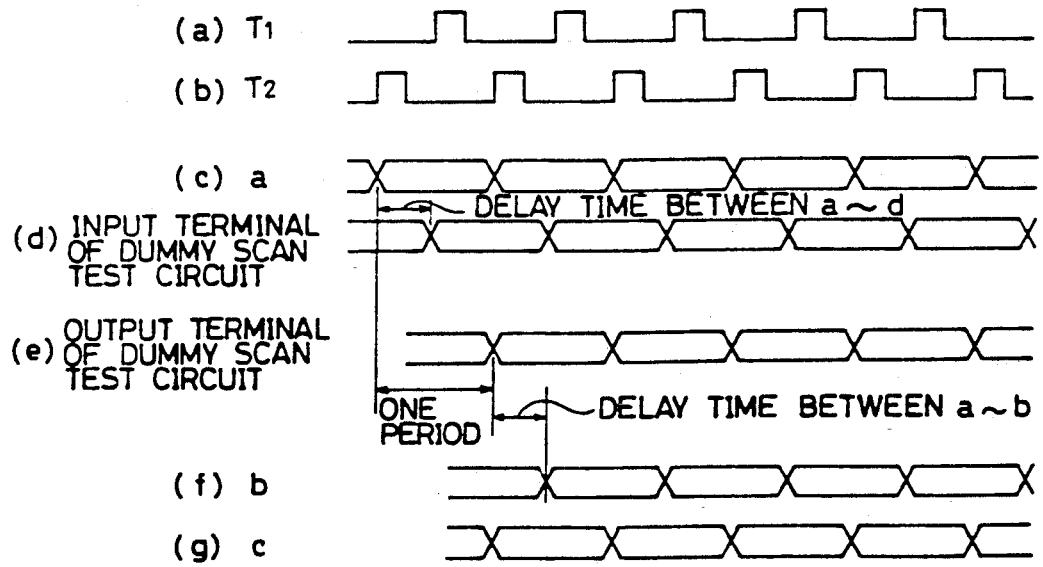
Figure 8:
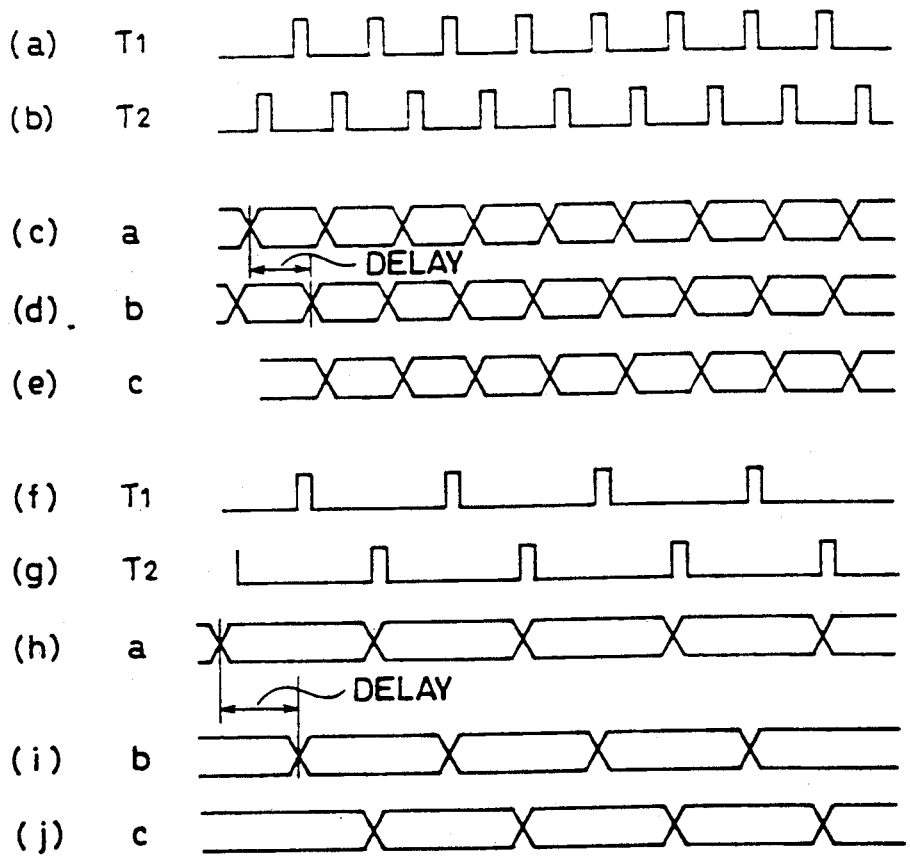

In the scan operation of the circuit block CB1, the scan test circuits SRL used for scan operation are the scan test circuits SRL (l+1) ~SR1 (l+m) and SRL (l+m+n+2). These scan test circuits are selected during the scan test circuit selection data input mode FIGS. 6 through 8 are timing charts for scan operation in the semiconductor integrated circuit device shown in FIG. 5. Scan operation of another embodiment of the invention will now be described with reference to FIGS. 6 through 8. The scan test circuits SRL (1) ~SRL (l+m) are continuously serially connected and scan test circuits SRL (l+m+1)...SRL (l+m+n) which act as simple data-through circuits for n bits are interposed between the scan test circuits SRL (l+m) and the SRL (l +m+n+1). The presence of these scan test circuits acting as data-through circuits produces a transmission delay time $t_{dab}$ data between FIG. 6 (c) and (d). Because of this transmission delay, synchronism to be provided by the scan clock signal is lost by an amount corresponding to one period, with the result that an output which is shifted by one period is outputted from the serial out terminal SO.

If suitable dummy scan test circuits SRL are selected from among scan test circuits SRL (l+m+1) ~SRL (l+m +n) acting as data-through circuits and data are shifted by the synchronism provided by the scan clock signal, then, as shown in FIG. 7, the delay time can be divided into a delay between the scan test circuit SRL (l+m+1) ~the dummy scan test circuit SRL and a delay time between the dummy test circuits SRL~SRL (l+M+n+1); thus, stabilized operation for clock signal synchronism can be obtained. In addition, in the above embodiment, dummy scan test circuits have been selected from among the scan test circuits acting as data-through circuits and scan shift operation has been used, whereby stabilized operation which synchronizes with two scan look signals has been obtained. However, as shown in FIG. 8, the period of the scan clock signal to be inputted to the terminals T1 and T2 may be prolonged so that even if the delay time due to data-through circuits exists, sufficiently stabilized synchronism can be obtained. Further, data-through circuits may be used to make it clear to how many periods the delay corresponds, and a number of imaginary dummy scan test circuits corresponding thereto may be provided for effecting scan shift operation.

Figure 9:
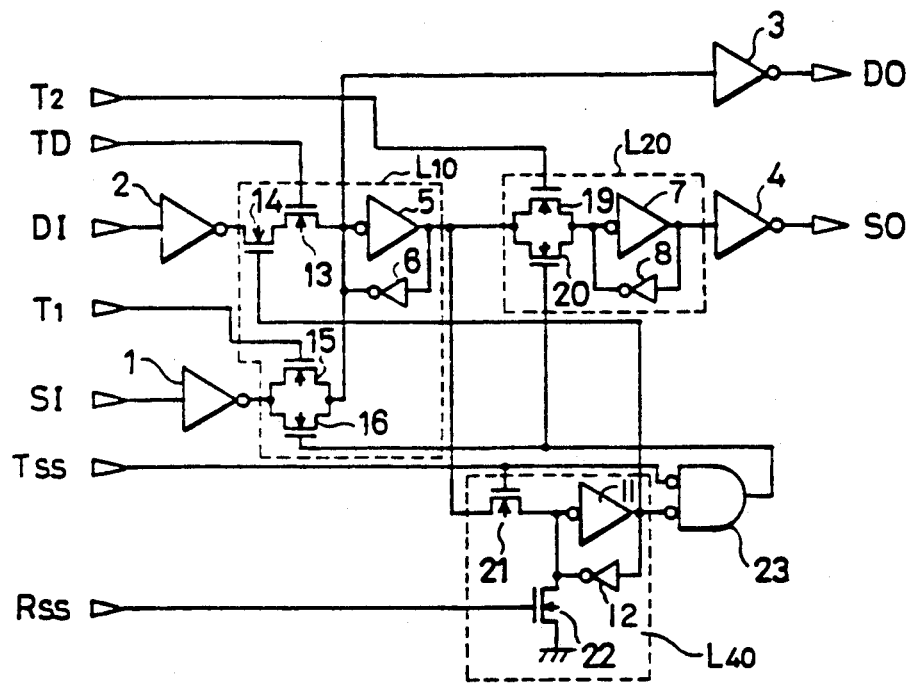
FIG. 9 is a block diagram showing another example of a scan test circuit.

FIG. 9 is a block diagram of a scan test circuit according to another embodiment of the invention.

While in the scan test circuit shown in FIG. 1, an asynchronous circuit has been used as a circuit block to be tested, in the scan test circuit shown in FIG. 9 a circuit block to be tested is limited to a synchronous circuit. In the example shown in FIG. 9, the latch circuit L30 shown in FIG. 1 and the terminal T3 which is given the clock signal for inputting data to said latch circuit L30 are omitted, while the input end of the inverter 3 is directly connected to the input of the inverter 5 of the latch circuit L10. Therefore, in the example shown in FIG. 9, the data held in the latch circuit L10 are inverted by the inverter 3 and outputted from the data output terminal DO.

Figure 10:
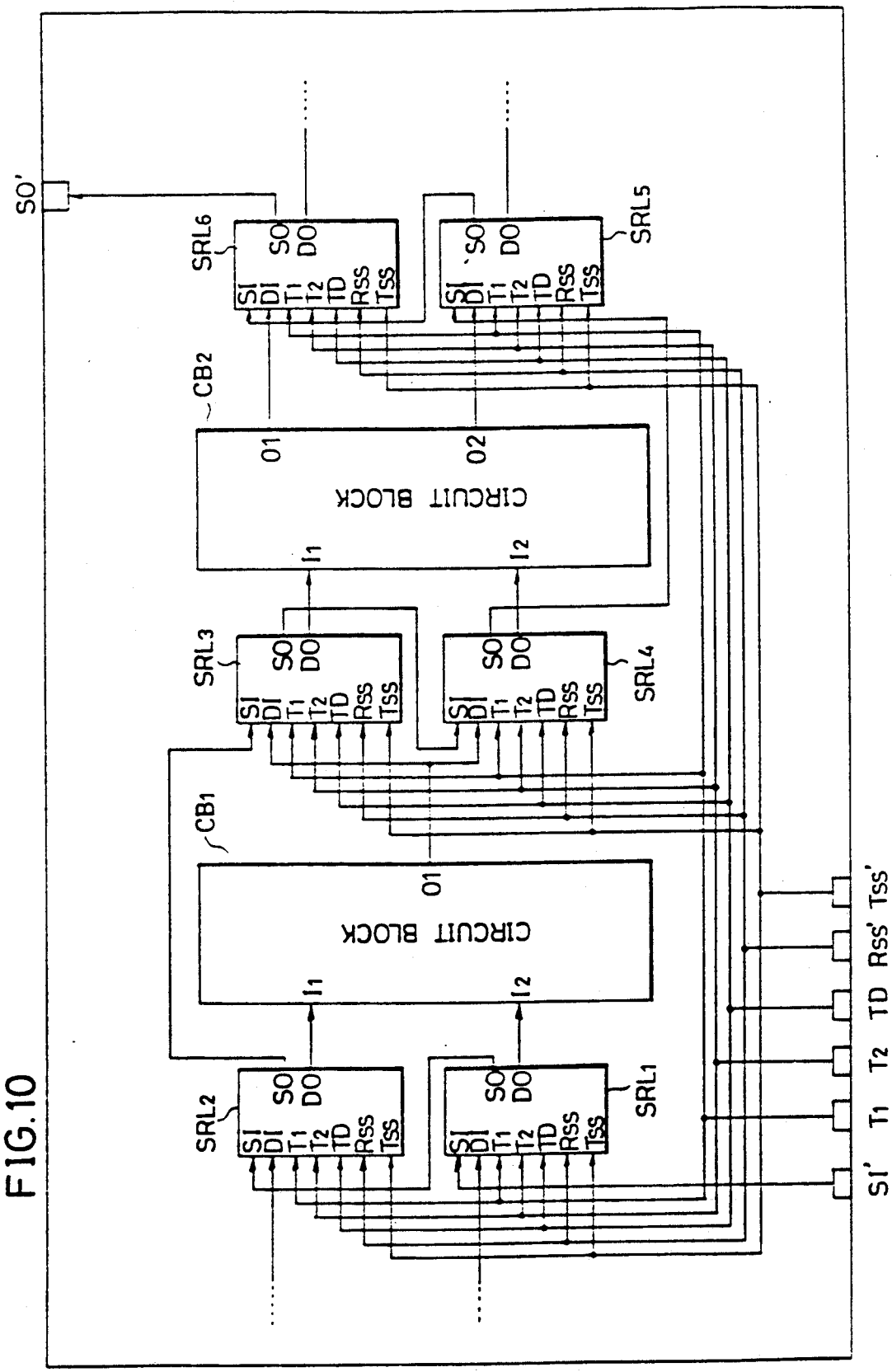
FIG. 10 is a block diagram of a semiconductor integrated circuit device containing the scan test circuit shown in FIG. 9.

FIG. 10 is a block diagram of a semiconductor integrated circuit device containing the scan test circuit shown in FIG. 9. The example shown in FIG. 10 differs from the example shown in FIG. 2 in that the clock signal inputted to the terminals T1, T2 and TD is inputted to all of the scan test circuits SRL1 through SRL6. However, the testing method is the same as in the example shown in FIG. 2.

Figure 11:
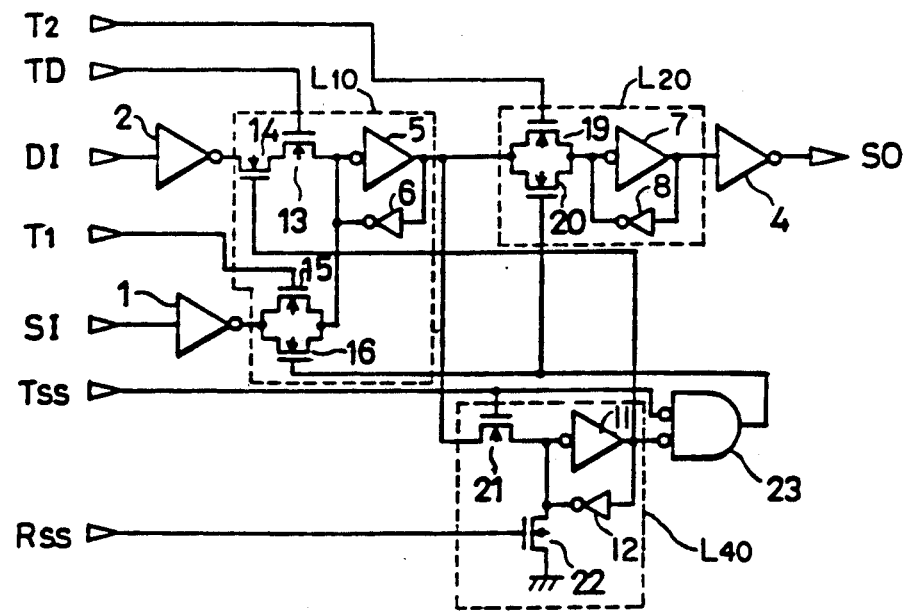
FIG. 11 is a block diagram showing another example of a scan test circuit.

In the scan test circuit shown in FIG. 11, the inverter 3 shown in FIG. 9 is omitted, and the data held in the second latch circuit L20 are inverted by the inverter 4 and outputted to the serial data output terminal SO.

Figure 12:
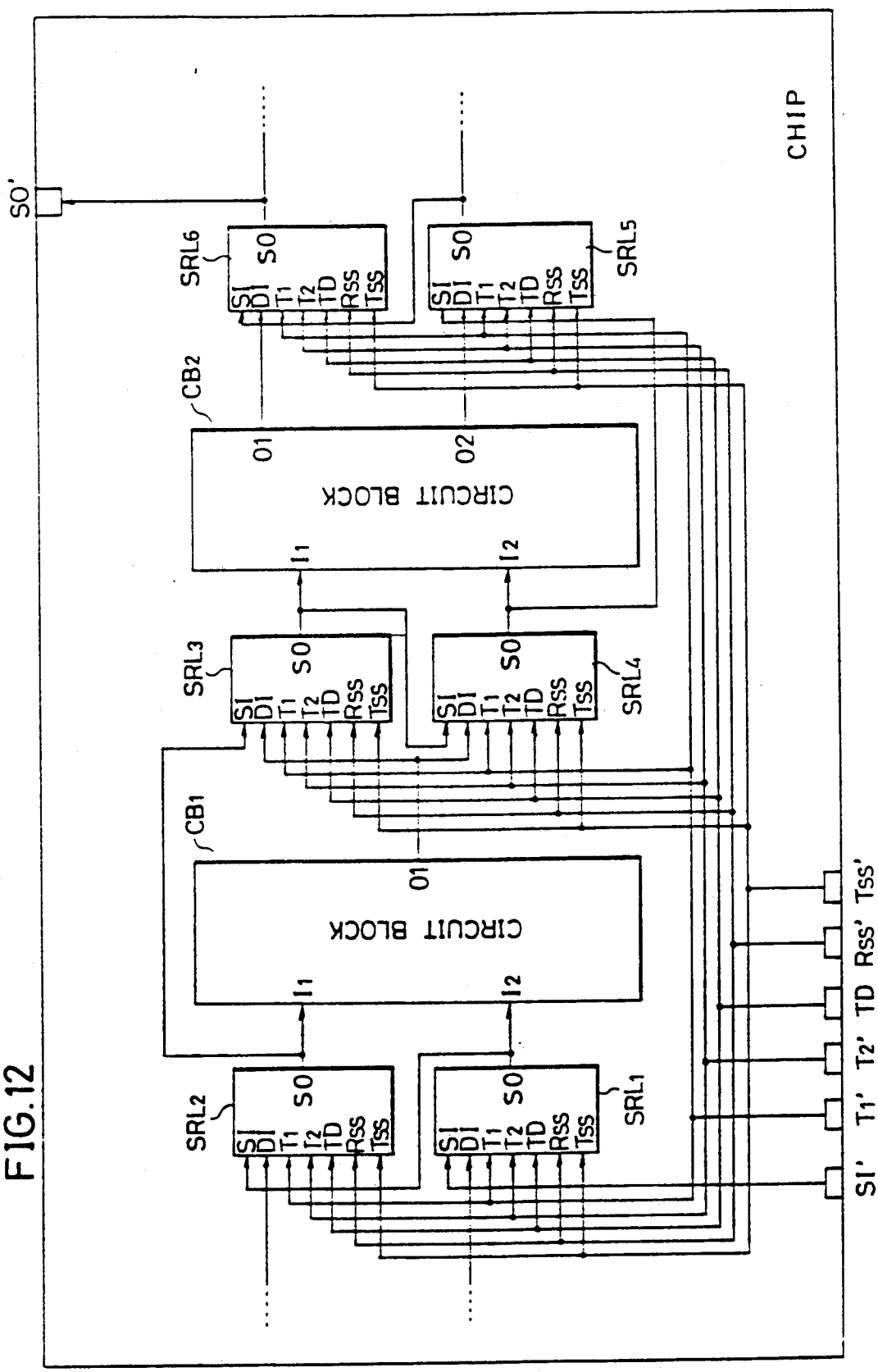
FIG. 12 is a block diagram of a semiconductor integrated circuit device containing the scan test circuit shown in FIG. 11.

FIG. 12 is a block diagram of a semiconductor integrated circuit device containing the scan test circuit shown in FIG. 11. In the example shown in FIG. 12, the output terminal SO of the scan test circuit SRL1 is connected to the input terminal 12 of the circuit block CB1 and also to the input terminal SI of the scan test circuit SRL2, while the output terminal SO of the scan test circuit SRL2 is connected to the input terminal I1 of the circuit block CB1 and to the input terminal SI of the scan test circuit SRL3. The output terminals SO of the other scan test circuits SRL3 through SRL6 are likewise connected. The operation is the same as in FIG. 2.

Figure 13:
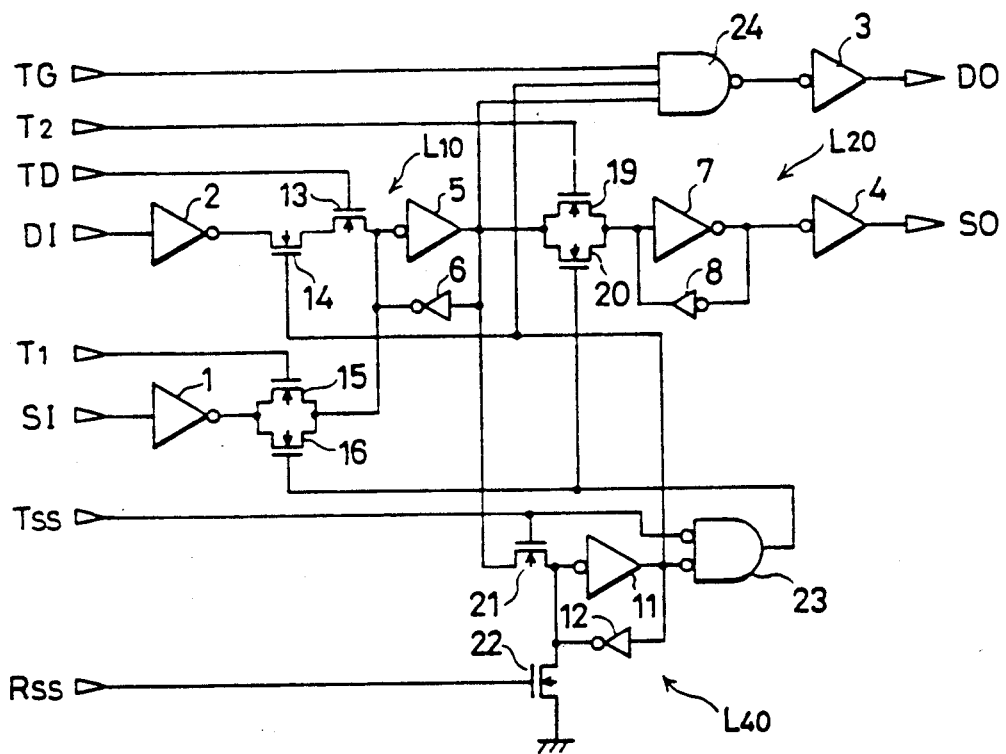
FIGS. 13 and 14 are block diagrams showing other examples of scan test circuits.

FIG. 13 is a block diagram showing a further example of a scan test circuit. FIG. 13 differs from FIG. 12 in the following respects. Test data are outputted from the terminal DO by a positive clock signal. For this purpose, a 3-input NAND circuit 24 is provided. One input end of said NAND circuit 24 is given the output of the latch circuit L10, another input end is given the output of the latch circuit L40, and the other input end is given the positive clock signal from the terminal TG, the output of the NAND circuit 24 being given to the inverter 3. A test pattern which is the output of the latch L10 is outputted to the terminal DO through the inverter 3 only when the positive clock signal is given from the terminal TG and the selection signal is given from the latch circuit L40.

Figure 14:
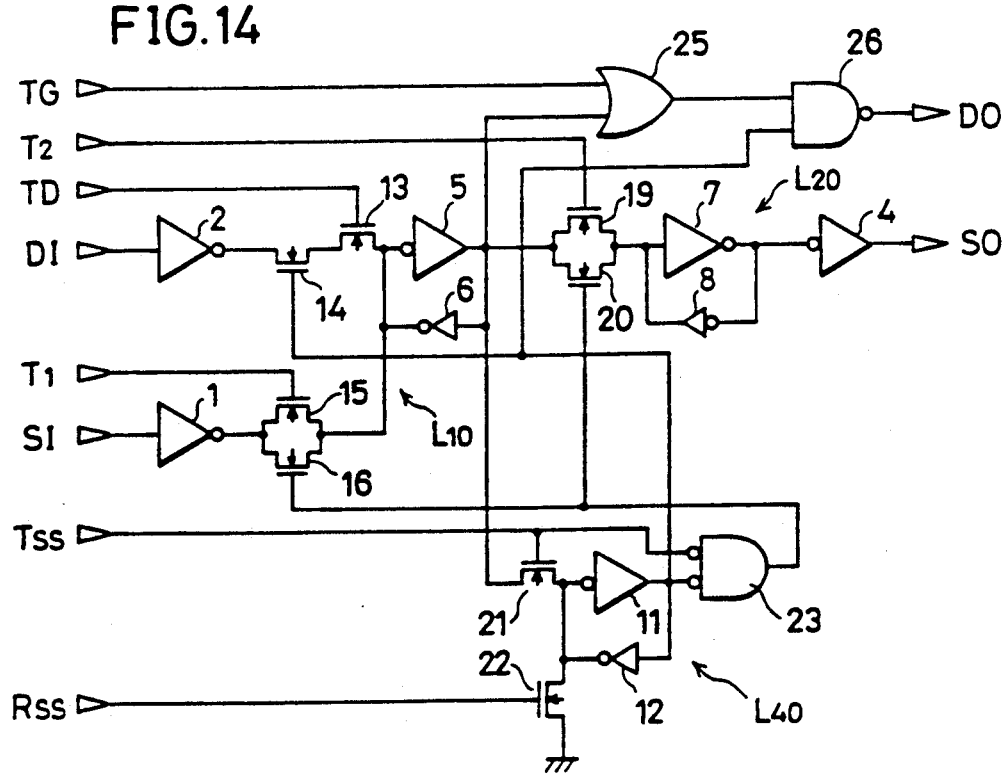

FIG. 14 is a block diagram showing a further example of a scan test circuit. The scan test circuit shown in FIG. 14 is adapted to output test data from the terminal DO in response to a negative clock signal. Provided for this purpose are a 2-input OR circuit 25 and a 2-input NAND circuit 26. One input end of the OR circuit 25 is given the positive signal from the terminal TG and the other input end is given the output of the latch circuit L10. The output of the OR circuit 25 is given to one input end of the NAND gate 26, and the other input end is given the selection signal from the latch circuit L40. And when the positive clock signal is given to the terminal TG of the OR circuit 25, the test data which are the output of the latch circuit L10 are given to the NAND circuit 26. When the NAND circuit 26 is given the selection signal from the latch circuit L40, t outputs the output of the OR circuit 25 to the terminal DO.

Figure 15:
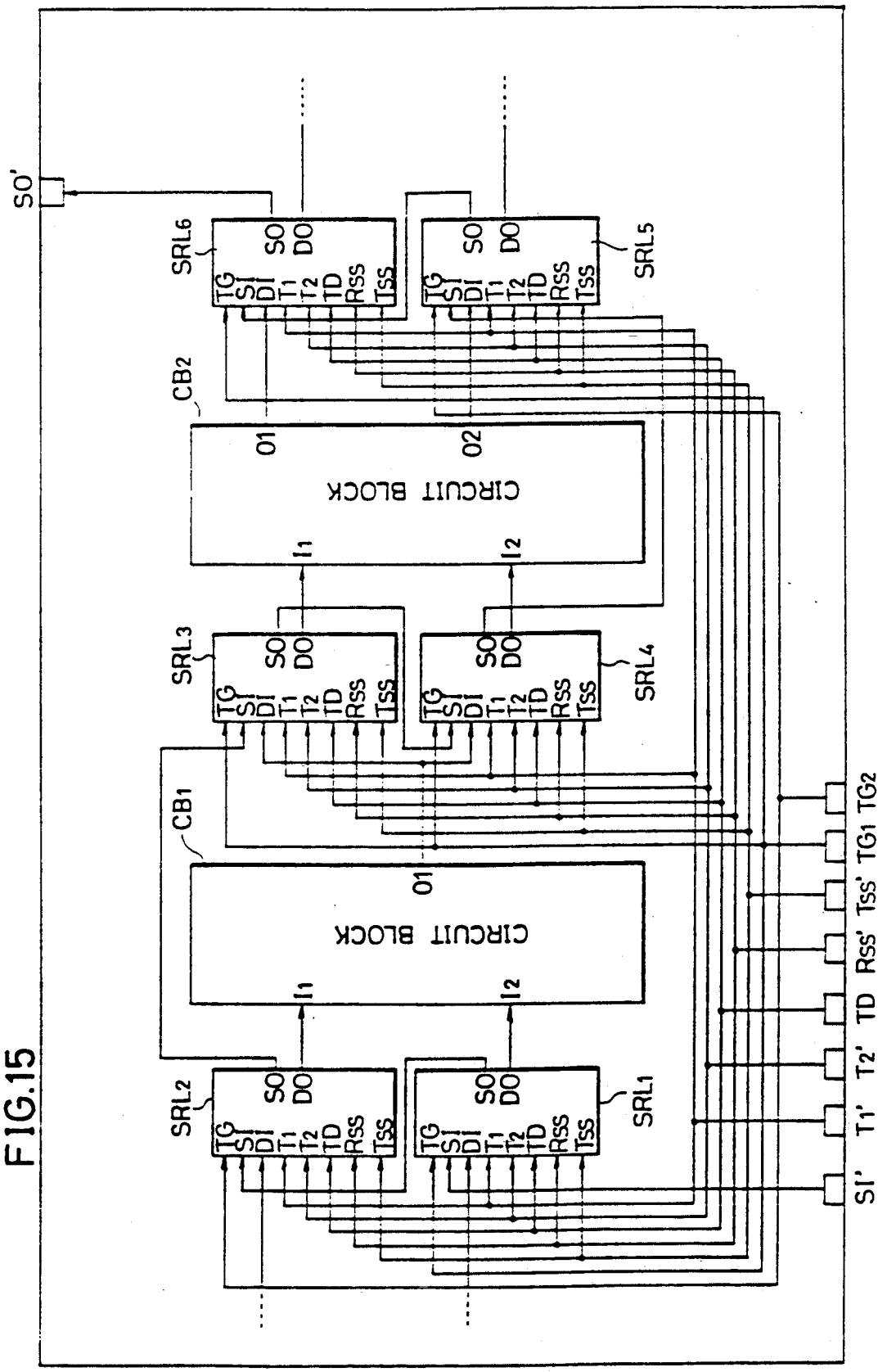
FIG. 15 is a block diagram showing a semiconductor integrated circuit device containing the scan test circuit shown in FIG. 13 or 14.

FIG. 15 is a block diagram of a semiconductor integrated circuit device containing the scan test circuit shown in FIG. 13 or 14. The semiconductor integrated circuit device shown in FIG. 15 is given at the scan test circuits SRL1, 3, 4 and 6 the positive or negative clock signal from the terminal TG1 and at the scan test circuits SRL2 and 5 the positive clock signal from the terminal TG2. The operation for test in this semiconductor integrated circuit device is the same as in the embodiment described above.

As has so far been described, according [o embodiments of the invention, latch means are provided in excess in the scan test circuit, wherein the selection data held in said latch means are used to cause the scan test circuit to act as a shift register or as a circuit for making the data "through"; therefore, the shift operation and the operation for making the data "through" can be optionally controlled. Furthermore, the number of scan paths used when testing the circuit block can be substantially reduced, thus shortening the test time. Further, since test data are serially transferred on the scan paths adapted to transmit test data, it is only necessary to provide two additional pins; a first pin serving as an input/output pin for inputting the reset signal and a second pin for inputting the clock signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A scan test circuit for testing a circuit by scanning data, comprising:
    a first input terminal to which 1-bit data are inputted;
    a second input terminal to which serial data are inputted;
    a first output terminal from which data are outputted;
    first latch means for latching data inputted to said first input terminal or serial data inputted to said second input terminal;
    second latch means for latching the data latched by said first latch means;
    third latch means for latching the data latched by said first latch means;
    a reset input terminal to which a reset signal is inputted;
    a control signal input terminal to which a control signal is inputted;
    a switching element for resetting said third latch means in response to the reset signal inputted to said reset input terminal;
    control means for outputting a gate control signal in response to the control signal input to said control signal input terminal or an output signal of said third latch means being of a first logic level;
    first gate means responsive to the gate control signal output from said control means for providing a serial data through connection of the serial data input to said second input terminal through said second latch means to said output terminal, whereby when the output of said third latch means is of the first logic level the serial data inputted to said second input terminal are outputted from said second latch means in a through manner; and
    second gate means responsive to an output of said third latch means attaining a second logic level for inhibiting 1-bit data input to said first input terminal from being input to said first latch means.

2. A scan test circuit as set forth in claim 1, further comprising:
    a second output terminal to which data are outputted;
    fourth latch means for latching data latched in said first latch means and outputting said data to said second output terminal; and
    third gate means for inhibiting data latched in said first latch means from being inputted to said fourth latch means in response to the output of said third latch means being of the first logic level, and allowing data latched in said first latch means to be shifted to said fourth latched means in response to the output of said third latch means being of the second logic level.

3. A scan test circuit as set forth in claim 1, further comprising:
    a second output terminal for directly outputting data inputted to said first latch means.

4. A scan test circuit as set forth in claim 1, further comprising:
    a clock input terminal to which a clock signal is inputted;
    a second output terminal for outputting data; and
    third gate means for inhibiting clock inputted by said clock input terminal from being outputted from said second output terminal in response to the output of said third and first latch means being of the first logic level, and for allowing clock inputted by said clock input terminal to be outputted from said second output terminal in response to the output of said third and first latch means being of the second logic level.

5. A semiconductor integrated circuit device comprising a plurality of scan test circuits, wherein each scan test circuit comprises:
   a first input terminal to which 1-bit data are inputted;
   a second input terminal to which serial data are inputted;
   a first output terminal from which data are outputted;
   first latch means for latching data inputted to said first input terminal or serial data inputted to said second input terminal;
   second latch means for latching the data latched by said first latch means;
   third latch means for latching the data latched by said first latch means;
   a reset input terminal to which a reset signal is inputted;
   a control signal input terminal to which a control signal is inputted;
   a switching element for resetting said third latch means in response to the reset signal inputted to said reset input terminal;
   control means for outputting a gate control signal in response to the control signal input to said control signal input terminal or an output signal of said third latch means being of a first logic level;
   first gate means responsive to the gate control signal output from said control means for providing a serial data through connection of the serial data input to said second input terminal through said second latch means to said output terminal, whereby when the output of said third latch means is of the first logic level the serial data inputted to said second input terminal are outputted from said second latch means in a through manner; and
   second gate means responsive to an output of said third latch means attaining a second logic level for inhibiting 1-bit data input to said first input terminal from being input to said first latch means.

6. A semiconductor integrated circuit device as in claim 5, further comprising:
   at least one circuit block to be tested,
   a serial data input terminal to which data are serially inputted, and
   a serial data output terminal from which data are serially outputted,
   wherein the first output terminal of one of the scan test circuits connects to an input terminal of said at least one circuit block and connects to the second input terminal of a second one of said scan test circuits, an output terminal of said at least one circuit block is connected to the first input terminal of a third one of said scan test circuits, and a second input terminal of said at least one circuit block and the second input terminal of the third one of said scan test circuits connect to the first output terminal of the second one of said scan test circuits, such that the plurality of scan test circuits define a single scan path between said serial data input terminal and said serial data output terminal.

7. A semiconductor integrated circuit device as in claim 5, each scan test circuit further comprising:
   a second output terminal to which data are outputted;
   fourth latch means for latching data latched in said first latch means and outputting said data to said second output terminal; and
   third gate means for inhibiting data latched in said first latch means from being inputted to said fourth latch means in response to the output of said third latch means being of the first logic level, and allowing data latched in said first latch means to be shifted to said fourth latch means in response to the output of said third latch means being of the second logic level.

8. A semiconductor integrated circuit device as in claim 7, further comprising:
   at least one circuit block to be tested,
   a serial data input terminal to which data are serially inputted, and
   a serial data output terminal from which data are serially outputted,
   wherein the input terminal of said at least one circuit block is connected to the second output terminal of a first one of said scan test circuits, the output terminal of said at least one circuit block is connected to the first input terminal of a second one of said scan test circuits, and the second input terminal of the second one of said scan test circuits is connected to the first output terminal of the first one of said scan test circuits in such a manner as to define a single scan path between said serial data input terminal and said serial data output terminal.

9. A semiconductor integrated circuit device as in claim 8, said plurality of scan test circuits further comprising a third scan test circuit, wherein:
   the second input terminal of said third scan test circuit connects to said serial data input terminal;
   the second output terminal of said third scan test circuit connects to a second input terminal of said at least one circuit block; and
   the first output terminal of said third scan test circuit connects to the second input terminal of the first one of said scan test circuits.

10. A semiconductor integrated circuit device as in claim 5, each scan test circuit further comprising:
   a second output terminal for directly outputting data inputted to said first latch means.

11. A semiconductor integrated circuit device as in claim 10, further comprising:
   at least one circuit block to be tested,
   a serial data input terminal to which data are serially inputted, and
   a serial data output terminal from which data are serially outputted,
   wherein the input terminal of said at least one circuit block is connected to the second output terminal of a first one of said scan test circuits, the output terminal of said at least one circuit block is connected to the first input terminal of a second one of said scan test circuits, and the second input terminal of the second one of said scan test circuits is connected to the first output terminal of the first one of said scan test circuits in such a manner as to define a single scan path between said serial data input terminal and said serial data output terminal.

12. A semiconductor integrated circuit device as in claim 11, said plurality of scan test circuits further comprising a third scan test circuit, wherein:
   the second input terminal of said third scan test circuit connects to said serial data input terminal;

the second output terminal of said third scan test circuit connects to a second input terminal of said at least one circuit block; and the first output terminal of said scan test circuit connects to the second input terminal of the first one of said scan test circuits.

13. A semiconductor integrated circuit device as in claim 5, each scan test circuit further comprising:

a clock input terminal to which a clock signal is inputted;

a second output terminal for outputting data; and third gate means for inhibiting clock inputted by said clock input terminal from being outputted from said second output terminal in response to the output of said third and first latch means being of the first logic level, and for allowing clock inputted by said clock input terminal to be outputted from said second output terminal in response to the output of said third and first latch means being of the second logic level.

14. A semiconductor integrated circuit device as in claim 13, further comprising:

at least one circuit block to be tested, a serial data input terminal to which data are serially inputted, and a serial data output terminal from which data are serially outputted, wherein the input terminal of said at least one circuit block is connected to the second output terminal of a first one of said scan test circuits, the output terminal of said at least one circuit block is connected to the first input terminal of a second one of said scan test circuits, and the second input terminal of the second one of said scan test circuits is connected to the first output terminal of the first one of said scan test circuits in such a manner as to define a single scan path between said serial data input terminal and said serial data output terminal.

15. A semiconductor integrated circuit device as in claim 14, said plurality of scan test circuits further comprising a third scan test circuit, wherein:

the second input terminal of said third scan test circuit connects to said serial data input terminal;

the second output terminal of said third scan test circuit connects to a second input terminal of said at least one circuit block; and the first output terminal of said third scan test circuit connects to the second input terminal of the first one of said scan test circuits.

* * * * *